United States Patent
Hutton (10) Patent No.: US 7,133,819 B1
(45) Date of Patent: Nov. 7, 2006

(54) METHOD FOR ADAPTIVE CRITICAL PATH DELAY ESTIMATION DURING TIMING-DRIVEN PLACEMENT FOR HIERARCHICAL PROGRAMMABLE LOGIC DEVICES

(75) Inventor: Michael D. Hutton, Mountain View, CA (US)

(73) Assignee: Altera Corporation, San Jose, CA (US)

(*) Notice: Subject to any disclaimer, the term of this patent is extended or adjusted under 35 U.S.C. 154(b) by 831 days.

(21) Appl. No.: 09/783,246

(22) Filed: Feb. 13, 2001

Related U.S. Application Data (60) Provisional application No. 60/228,066, filed on Aug. 24, 2000, provisional application No. 60/261,523, filed on Jan. 12, 2001.

(51) Int. Cl.
*G06F 17/50* (2006.01)
*H03K 17/50* (2006.01)
*H03K 19/00* (2006.01)

(52) U.S. Cl. ............... 703/19; 716/4; 716/5; 716/6; 716/8

(58) Field of Classification Search .......... 703/19–20, 703/121; 716/2, 4, 7–14, 16–18, 6, 5; 326/39–41
See application file for complete search history.

(56) References Cited

U.S. PATENT DOCUMENTS

| | | | |
|---|---|---|---|
| 5,237,514 A * | 8/1993 | Curtin .................. | 716/10 |
| 5,550,782 A | 8/1996 | Cliff et al. | |
| 5,659,484 A | 8/1997 | Bennett et al. | |
| 5,689,195 A | 11/1997 | Cliff et al. | |
| 6,080,201 A * | 6/2000 | Hojat et al. .............. | 703/14 |
| 6,215,326 B1 | 4/2001 | Jefferson et al. | |
| 6,367,056 B1 * | 4/2002 | Lee ...................... | 716/5 |

OTHER PUBLICATIONS

Hutton et al., "Characterization and Parameterized Random Generation of Digital Circuit" 33rd Design Automation Conference 1996 Las Vegas, Nev. p. 94-99.*
Hutton et al., "Characterization and Parameterized Random Generation of Digital Circuit" Thesis 1997 University of Toronto. p. 123 pages.*
Hutton et al., "Equivalence Classes of Clone Circuits for Physical-Design Benchmarking" 1999. p. VI-428 to VI-431 IEEE.*
Hutton et al., "Characterization and Parameterized Random Generation of Digital Circuits" 1996 DAC. p. 94-99.*
Hutton et al., "Applications of Clone Circuits to Issue in Physical-Design" 1999. p. VI-448 to VI-451 IEEE.*
Wilton.S.J.E., "Heterogenous Technology Mapping for Area Reduction in FPGA's with Embedded Memory Arrays" 2000. IEEE p. 56-68.*

(Continued)

*Primary Examiner*—Paul L. Rodriquez
*Assistant Examiner*—Tom Stevens
(74) *Attorney, Agent, or Firm*—Beyer Weaver & Thomas, LLP (57) ABSTRACT

Provided is a method for estimating delay data comprising receiving an electronic representation of a source electronic design, estimating the criticality of connections which have not yet been placed across a boundary based on statistical data received from at least one other design and revising the design in a manner that biases the design towards a state in which connections with the highest criticality have their delays minimized. A statistical estimate is generated for uncut connections on a path in a partially placed source design comprising receiving at least one source design, partitioning the design, and generating statistical data corresponding to each type of partitioning cut.

30 Claims, 8 Drawing Sheets

OTHER PUBLICATIONS

Hutton et al., "Timing-Drivent Placement for Hierarchical Programmable Logic Devices" 2001. p. 3-11 FPGA 2001.*

Hutton et al., "Characterization and Parameterized Generation of Synthetic Combination Benchmark Circuits" 1998. p. 985-996 IEEE.*

Hutton et al., "Timing-Driven Placement for Hierarchical Programmable Logic Devices". Talk describing aspects of the invention. Monterey, California -Feb. 11, 2001 (paper attached).

V. Betz, Architecture and CAD for Speed and Area Optimization of FPGA's, Ph.D. Dissertation, University of Toronto, 1998.

Jason Cong et al., "Large Scale Circuit Partitioning with Loose/Stable Net Removal and Signal Flow Based Clustering", Proc. IEEE Int'l Conference on Computer-Aided Design, pp. 441-446, Nov. 1997.

W.E. Donath et al., "Timing Driven Placement Using Complete Path Delays", in Proc. 27$^{th}$ ACM/IEEE Design Automation Conference, pp. 84-89, 1990.

Carl Ebeling et al., "Placement and Routing Tools for theTriptych FPGA", IEEE Trans. On VLSI, vol. 3, No. 4, pp. 473-481, Dec. 1995.

Jon Frankle, "Iterative and Adaptive Slack Allocation for Performance-Driven Layout and FPGE Routing", in Proc. 29$^{th}$ ACM/IEEE Design Automation Conference, pp. 536-542, 1992.

P. Leventis, "Placement algorithms and routing architecture for long-line based FPGA's", Bachelor thesis, University of Toronto 1999.

Alexander Marquardt et al., "Timing-Driven Placement for FPGA's", in Proc. ACM/SIGDA FPGA Conference, FPGA00, pp. 203-213, 2000.

Sudip K. Nag and Rob A. Rutenbar, "Performance-Driven Simultaneous Placement and Routing for FPGA's". IEEE Trans. On CAD for Integrated Circuits and Systems, vol. 17, No. 6, pp. 499-518, Jun. 1998.

Shih-Lian Ou and Massoud Pedram, "Timing-Driven Placement Based on Partitioning with Dynamic Cut-net Control", in Proc. 37$^{th}$ ACM/IEEE Design Automation Conference, pp. 472-476, 2000.

Laura A. Sanchis, "Multiple-way network partitioning", IEEE Trans. On Computers, vol. 38, No. 1, Jan. 1989.

Prashant Sawkar and Donald Thomas, "Multi-Way Partitioning for Minimum Delay for Look-Up Table Based FPGAs". In Proc. 32$^{nd}$ ACM/IEEE Design Automation Conference, pp. 201-205, 1995.

S.A. Senouci et al., "Timing-Driven Floorplanning on Programmable Hierarchical Targets", in Proc. ACM/SIGDA FPGA Conference, FPGA98, pp. 85-92, 1998.

S. Sutanthavibul and E. Shragowitz, "Dynamic Prediction of Critical Paths and Nets for Constructive Timing-Driven Placement", in Proc. 28$^{th}$ ACM/IEEE Design Automation Conference, pp. 632-635, 1991.

W. Swartz and C. Sechen, "Timing-Driven Placement for Large Standard Cell Circuits", in Proc. 32$^{nd}$ ACM/IEEE Design Automation Conference, pp. 211-215, 1995.

* cited by examiner

METHOD FOR ADAPTIVE CRITICAL PATH DELAY ESTIMATION DURING TIMING-DRIVEN PLACEMENT FOR HIERARCHICAL PROGRAMMABLE LOGIC DEVICES

CROSS-REFERENCE TO RELATED APPLICATIONS

This application claims priority of (i) provisional U.S. Patent Application Ser. No. 60/228,066 filed Aug. 24, 2000, titled "Method for Adaptive Critical Path Delay Estimation During Timing-Driven Placement for Hierarchical Programmable Logic Devices", and (ii) provisional U.S. Patent Application Ser. No. 60/261,523 filed Jan. 12, 2001, titled "Method for Adaptive Critical Path Delay Estimation During Timing-Driven Placement for Hierarchical Programmable Logic Devices" which are each incorporated by reference in their entireties.

BACKGROUND OF THE INVENTION

The present invention relates to computer-assisted methods and apparatus for generating or compiling electronic designs such as designs for digital integrated circuits. More specifically, the invention relates to improvements in using timing information while compiling electronic designs.

Electronic design automation ("EDA") is becoming increasingly complicated and time consuming, due in part to the greatly increasing size and complexity of the electronic devices designed by EDA tools. Such devices include general purpose microprocessors as well as custom logic devices including Application Specific Integrated Circuits ("ASICs"). The design of even the simplest of these devices typically involves generation of a high level design, logic simulation, generation of a network, timing simulation, etc.

Meeting timing requirements is essential to the correct operation of an integrated circuit. For example, for a plurality of D-type flip-flops ("DFFs") to feed through some logic to another plurality of DFFs, it is generally required that the signals from the first set of DFFs must finish propagating through any intermediate logic and have settled to their final state on the D-input of each of the destination DFFs before the next rising edge of the clock. If the delay through the resulting logic is greater than the time between rising clock edges, then the state that the destination DFFs will hold on the next clock edge will be undefined.

In order to meet timing requirements optimization methods are applied. Optimizing a circuit can occur at any time during synthesis, technology mapping, clustering, placement, or routing. Most optimization methods require an identification of "critical connections" between circuit elements or blocks. Emphasis is made during optimization to optimize the timing of those connections having the greatest criticality. For example, during placement, the placement algorithm will attempt to keep those elements or blocks having a critical connection in a configuration where the connection would be made with as little delay as possible. A critical path is a path that has the longest delay. In fact, there may be several critical paths in a circuit. The cycle time of the clock that controls the DFF's at the beginning and end of the path cannot be any less than this delay. A critical path may consist of one or more connections, and all those connections will be critical.

Several different methods are used in circuit optimization to determine which connections are critical and therefore need to be made via fast wiring lines to avoid slowing down the circuit. Optimization is typically required in the conversion or placement of an electronic design in the form of a netlist into a physical device, such as an FPGA or CPLD. A traditional recursive partitioning algorithm will recursively divide an electronic design in half and repeat the division until the design is fully placed into the device. Partitioning methods may be applied to flat architectures such as gate arrays but are especially suitable for hierarchical architectures such as Altera's APEX 20K family of devices. In hierarchical architectures, crossing center boundaries involves significant costs in the form of delays added. Typically, as an electronic design is divided in half and again in half, the placement tool will attempt to minimize the wires which cross between physical half A and physical half B of the physical device to avoid lengthy delays across critical paths. As the wire placement or "cut" crosses boundaries lower in the hierarchy, smaller delays are added for each cut until the point where the wire placement between two cells occurs entirely within a cell and no additional delay is added.

The goal of this process is to obtain a faster circuit, generally when the longest delay of the placed design into the physical device is minimized. This measure is often stated in terms of a faster frequency for the circuit. After every cut of the design into the physical part the user or tool will know the actual delays contributed by that cut since for any such physical electronic device, the logic delays across the boundaries are known for that architecture. Since interconnect delays for the architecture are known for a fixed distance and load, a fully placed netlist has a deterministic timing analysis. A partially placed netlist, however, has a known timing analysis only if the placement algorithm gives the timing analyzer an estimate of unknown interconnect delays for edges not yet routed or placed.

A netlist with nodes and edges annotated with their electrical delay allows the user to compute, for each node and edge, the maximum delay from a source or to a destination, and hence the length of the longest path through that node or edge. Given a target delay (constraint) on an A to B path, the slack delay for that path is the (most stringent) constraint minus the actual delay of the path For a given node or edge, the slack of the node or edge is the minimum slack over all paths which contain the node or edge. All these values are well-defined in a synchronous netlist, and computable in linear time with several graph traversals.

A critical path is one which has the minimum slack over all paths. In a single-clock system with a single global fmax (register—register) delay constraint, this is equivalent to the path with the maximum delay. In a multi-clock system with different fmax specifications for different clocks, or with specific point-to-point path constraints, minimum slack is not equivalent to maximum delay. The goal of a timing driven compilation is to maximize the worst-case (minimum) slack.

One problem with the use of recursive partitioning as an algorithm for timing-driven placement is that the true path delays are not known in the early stages of placement. Therefore identifying the critical paths before the netlist has been placed is difficult. The partitioning algorithm can minimize the number of critical nets which are cut early on, yet these nets may not be the true critical nets by the time the partitioning tool has proceeded several levels deep in the placement, due to the delays added by the cuts. This problem is intrinsic whether or not the target architecture is hierarchical, but is exacerbated by non-uniform delays in a hierarchical part.

What is needed therefore is an improved method for estimating the delays for edges or connections which have not yet been placed in order to identify accurately the critical paths.

SUMMARY OF THE INVENTION

The present invention provides a method for more accurately estimating delays for connections which have not yet been placed. Partitioning places a source design into a target device and divides the design in half, followed by successive divisions of the source design until the entire source design has been cut or placed in the device and all connections in the source design correspond to wires in the physical device. The objective in the process is to avoid placing connections which require fast wires across slow boundaries. As a partition proceeds in phases, determining which connections are critical (and therefore require faster wires) is done based on actual delay data for cuts already placed and estimated data for the connections which have not yet been cut in the device. The present invention provides a method for estimating delay data comprising receiving a source electronic design, estimating the criticality of connections which have not yet been placed across a boundary based on statistical data received from at least one other design and revising the design in a manner that biases the design towards a state in which connections with the highest criticality have their delays minimized.

In yet another embodiment, the partitioning and estimation of delays on the paths is repeated successively prior to a next phase of partition.

Another aspect of the invention pertains to computer program products including a machine readable medium on which is stored program instructions, tables or lists, and/or data structures for implementing a method as described above. Any of the methods, tables, or data structures of this invention may be represented as program instructions and/or data structures that can be provided on such computer readable media.

Yet another aspect of the present invention pertains to a computer system comprising at least one CPU, memory, and an interface for communicating with an individual. The computer system is configured to receive the electronic representation of the design, estimate the criticality of connections which have not yet been placed across a boundary based on statistical data received from at least one other design and to revise the electronic representation toward a state in which high criticality connections are changed in a manner that reduces delay.

These and other features and advantages of the present invention are described below with reference to the drawings.

DETAILED DESCRIPTION

Introduction and Overview

Reference will now be made in detail to some specific embodiments of the invention. Examples of specific embodiments are illustrated in the accompanying drawings. While the invention will be described in conjunction with these specific embodiments, it will be understood that it is not intended to limit the invention to any particular specific embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Some of the terms used herein are not commonly used in the art. Other terms have multiple meanings in the art Therefore, the following definitions are provided as an aid to understanding the description that follows. The invention as set forth in the claims should not necessarily be limited by these definitions.

The term "compiler" is used throughout this specification to refer to software and apparatus for running such software that compiles an electronic design. Its functions may include extracting and synthesizing a netlist, mapping the design to a given hardware architecture, placing and routing the design, simulating the design, etc.

The term "source electronic design" generically refers to the logical structure of an electronic device such as an integrated circuit. It may be implemented on hardware (usually referred to herein generically as a "target hardware device"). During the design and development effort, an electronic design may exist in various states or stages. It may be provided as a high level Boolean representation (encoded in a hardware design language for example), a schematic or circuit representation, or any other form representing the logical arrangement of a device. It may include other facets such as floor-plan constraints, wave-form constraints, timing constraints, fitting constraints, etc. At the gate level, it may exist as a netlist (whether synthesized or not) prior to placement on a target hardware device. It may even include completed place and route assignments.

A "netlist" is used to describe the functionality of a digital circuit design that can be implemented on a programmable logic device or other target hardware device. The netlist is represented as hierarchical collection of gates, state machines, high level constructs such as counters or adders, or any other means of defining a collection of outputs based on a collection of inputs. The nodes of the netlist (gates, state machines, etc.) are connected together via nets. Each of these nets is associated with a named digital signal. A netlist may be synthesized to remove redundant logic, simplify the gate layout provided by a user, etc.

When in the form of a synthesized netlist, a source electronic design may be divided into "logic cells" representing various logic functions within the electronic design. During compilation, these logic cells are mapped onto physical structures known as "logic elements" which reside on the target hardware device. The criteria for mapping gates into logic cells is that the resulting logic cell must be able to be put into one logic element. An example of a logic cell is a collections of gates (connected in some way and implemented in a look-up table) combined with a register and configured to implement a multiplexer.

The term "target hardware device" refers to a hardware device on which an electronic design is implemented. Examples include circuit boards and systems including multiple electronic devices and multi-chip modules, as well as integrated circuits. Specific examples of integrated circuits include traditional multi-purpose microprocessors, traditional integrated circuits with full custom layouts, hard-wired ASICs (e.g., gate arrays) designed with high level design tools, and programmable integrated circuits such as FPGAs and PLDs. In the case of non-programmable integrated circuits such as gate arrays, the electronic design defines the arrangement of metal lines on one or more metallization layers of the target hardware device. In the case of programmable integrated circuits such as PLDs, the electronic design defines the gates as well as interconnects to be programmed on the target hardware device.

In the context of this invention, a target hardware device typically includes a plurality of logic elements which house logic cells from an electronic design in order to implement the logic functions specified by these cells. The logic elements are typically a fundamental element of the hardware device's architecture on which different logic gates can be defined. These elements may be grouped into blocks such that each logic element is associated with a block (or other arbitrary containment entity). There may be higher level organization in the device such that logic blocks are grouped into rows or some other arbitrary entity.

A "connection" is an electrical link from the output of one block to the input of another block. Often, a connection is embodied as a conductive strip (e.g. a metal strip) or a switch together with a conductive strip. Examples of these blocks include logic gates, registers, memory, logic cells, I/O pads, groups of logic elements such as logic array blocks, etc.

A "path" is several connections in series. A path could include the circuit elements as well as the connections lying between them. The timing analysis tool will measure between points to establish a set of paths. The points measured could be input to output, input to register, register to register, or register to output.

The term "fitting" is used throughout this specification to describe a process whereby a compiler fits an electronic design onto a target hardware device. The term "fit" may be used interchangeably with the phrase "place and route." As this synonym suggests, fitting can be divided into two phases: a placement phase and a routing phase. The present invention can be applied to all phases of the design process, including but not limited to placement and routing. In placement, a compiler positions logic cells of the electronic design with respect to logic elements of a target hardware device. The invention may employ generic place and route algorithms—including many conventional and commercially available algorithms—employed during design development.

Figure 1:
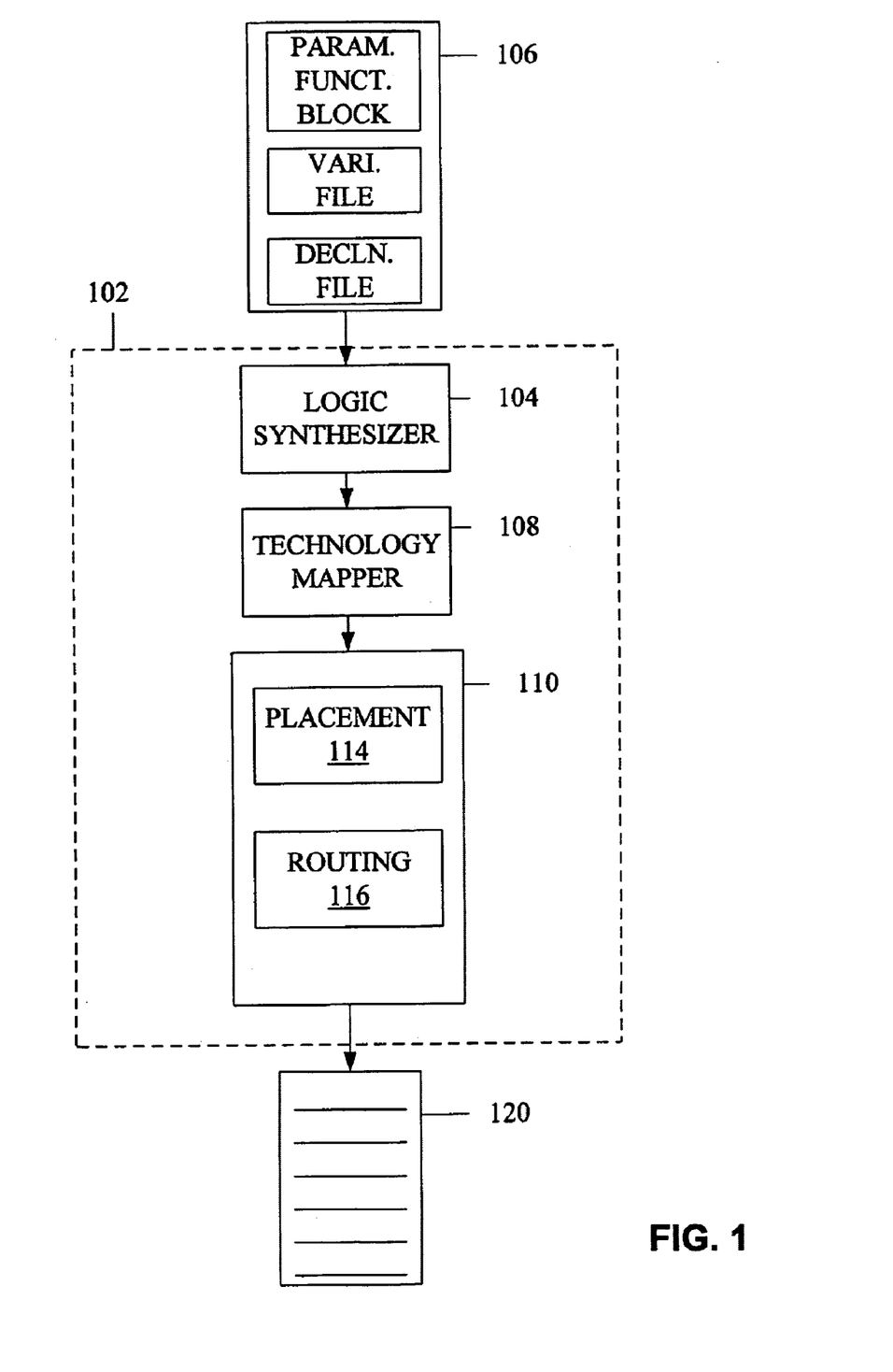
FIG. 1 is a schematic/process diagram illustrating the components and general flow of a compiler that may be used in conjunction with the present invention.

In a specific embodiment, the compiler is divided into software submodules. Referring to FIG. 1, an exemplary compiler 102 includes a logic synthesizer 104 which creates a synthesized netlist from a user's high level electronic design 106 (including variation files, parameterized functional block files, declaration files, symbol files, etc.). Compiler 102 also includes a technology mapper 108 that maps gates from the synthesized netlist into logic cells. Finally, compiler 102 includes a place and route module 110 that in turn includes a placement module 114 and a routing module 116. Placement module 114 places logic cells onto specific logic elements of a target hardware device. Routing module 116 connects wires between the inputs and outputs of the various logic elements in accordance with the logic required to implement the electronic design. Compiler 102 outputs a compiled design 120. It should be understood that other compiler designs may be employed with this invention. For example, some compilers will include a partitioning module to partition a technology-mapped design onto multiple hardware entities. In addition, the compiler may be adapted to handle hierarchical designs, whereby synthesis, mapping, etc. are performed recursively as the compiler moves down branches of a hierarchy tree. The present invention uses the partitioning algorithm in this manner to handle placement and routing functions.

A user can enter an initial or source electronic design by various methods. For example, a schematic editor program allows the user to enter and/or modify a schematic diagram of the electronic design using the display screen, generating a net list (summary of connections between components) in the process. This is commonly referred to as a schematic capture method. An equivalent method for entering an electronic design involves providing a description of the design in a Hardware Description Language (HDL). Examples of HDLs include Verilog and VHDL. The syntax of a VHDL description is described in IEEE Standard VHDL Language Reference Manual (IEEE Std 1076-1987). Like the schematic representation, the HDL representation also provides a net list.

Figure 2:
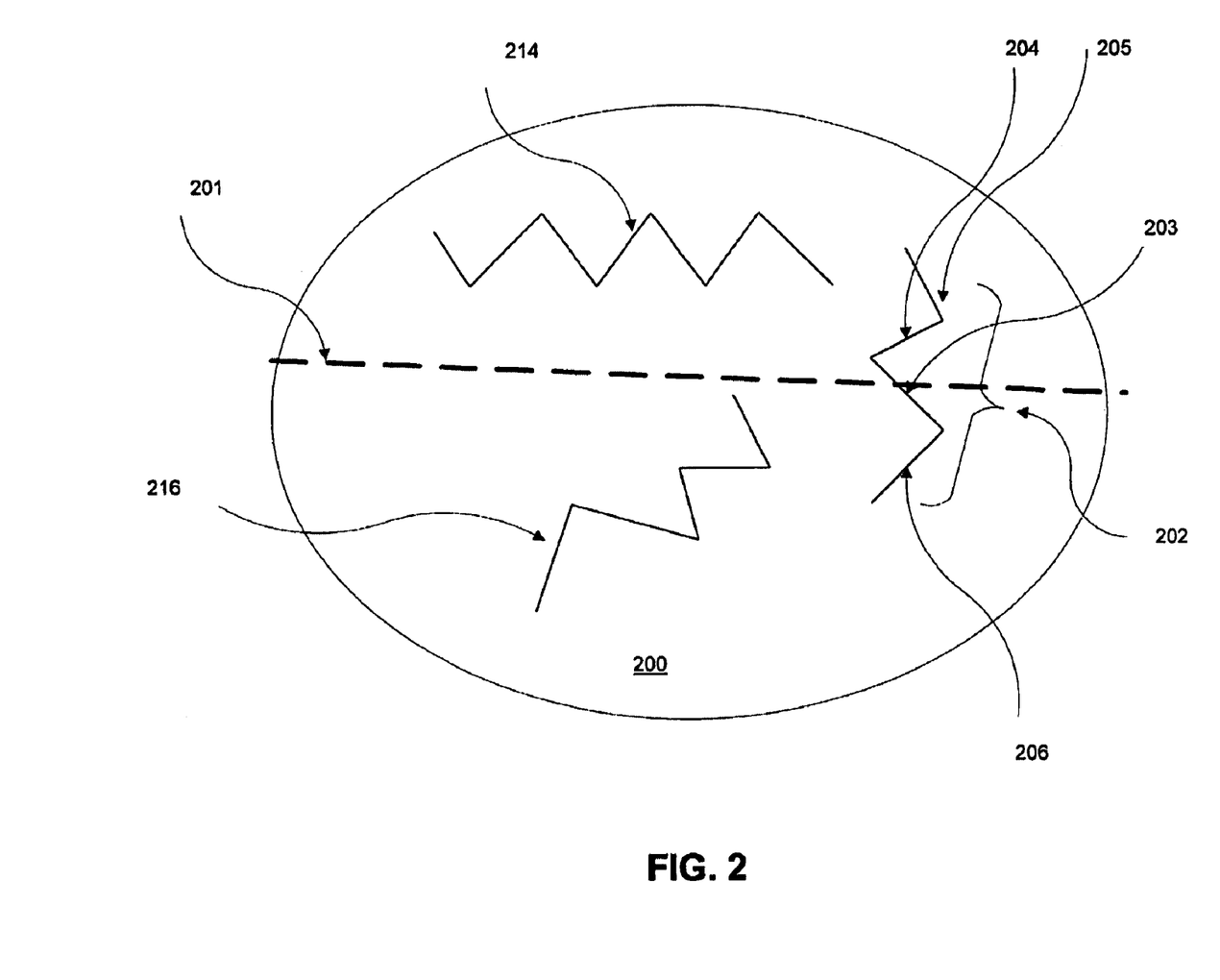
FIG. 2 illustrates a path cut by a boundary.

A common goal in partitioning is to partition or divide a design to minimize the number of input/output pins on the devices. During placement of the design by partitioning methods, actual delays for connections are only known for the connections already placed across boundaries. As shown in FIG. 2, conventional partitioning algorithms attempt to cut the source electronic design 200 on paths which are not critical. The determination as to criticality is a function of the length of the path, i.e. the number of corrections in the path. Here the first cut 201 crosses path 202 at connection 203. Connections 204, 205, and 206 are uncut during this phase. Path 214 and path 216, consisting of 7 and 5 connections respectively were not cut, consistent with a partitioning tool's attempt to avoid cuts on more critical connections. After this partition phase, criticality of a path is determined by a combination of delays associated with the actual cuts (such as the cut on connection 203) and an estimate as to future cuts. In conventional partitioning, the estimate is based only on the number of uncut connections.

Figure 3:
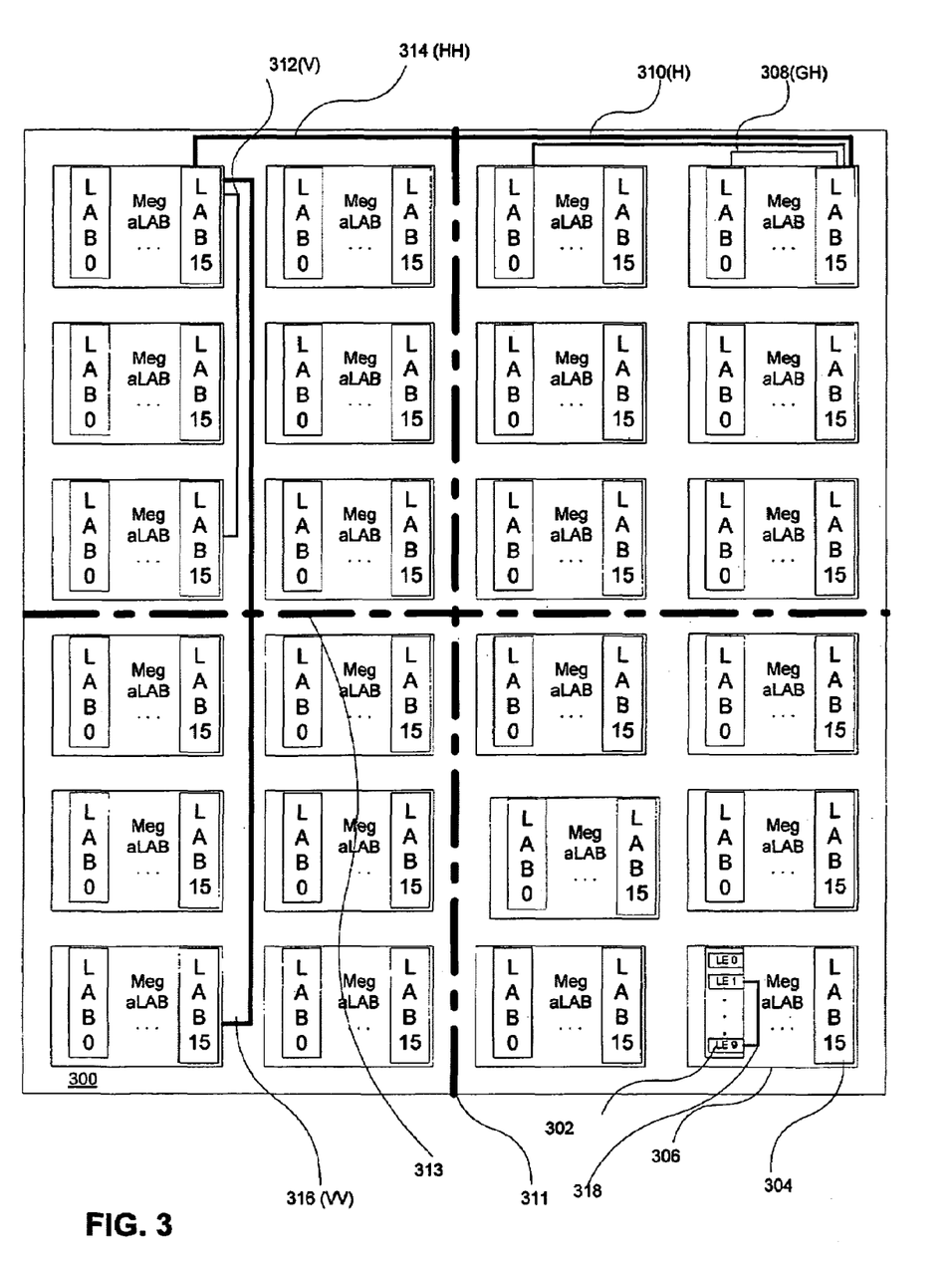
FIG. 3 is an idealized block representation of the architecture of an arbitrary hardware device, including interconnects.

An example of a programmable logic hardware device to demonstrate the role of partitioning is shown in FIG. 3. This idealized representation roughly conforms to the layout of the APEX 20K400 programmable logic device, a commercial product from Altera Corporation of San Jose, Calif.

To fit a logic design onto a target hardware device such as that shown in FIG. 3, a synthesized netlist is divided into logic cells which are placed in the various logic elements as uniquely defined below. Thus, each logic cell from the synthesized netlist resides in a unique single logic element.

Often, a multilevel hierarchical structure such as that shown in PLD 300 includes multiple levels of routing lines (interconnects). These connect the uniquely placed logic cells to complete circuits. In PLD 300, for example, four levels of interconnect are provided, one for each of the four hierarchy levels.

The basic logic-element (LE) 302 is a 4-input LUT and DFF pair. Groups of 10 LEs are grouped into a logic-array-block or LAB 304. Interconnect within an LAB 304 is complete, meaning that a connection from the output of any LE 302 to the input of another LE 302 in its LAB always exists, and any signal entering the input region can reach every LAB.

Groups of 16 LABs form a MegaLab 306. Interconnect within a MegaLab requires an LE to drive a GH 308 (MegaLab global H) line, a horizontal line the width of the MegaLab, which switches into the input region of any other LAB in the same MegaLab. Adjacent LABs have the ability to interleave their input regions, so an LE in LAB i can usually drive LAB i+1 without using a GH line 308. A 20K400 MegaLab, for example, contains 279 GH lines.

The top-level architecture is a 4 by 26 array 300 of MegaLabs. Communication between MegaLabs is accomplished by global H 310 (horizontal) and V 312 (vertical) wires, which switch at their intersection points. The H and V lines are segmented by a bi-directional segmentation buffer, 311 and 313, at the horizontal and vertical centers of the chip. The use of a single (half-chip) H or V line as H or V and a double or full-chip line through the segmentation buffer is denoted as HH 314 or VV 316. In the APEX architecture, H 310 and V 312 lines cannot drive LEs directly; they drive a GH which then functions as in the MegaLab case above (so an H delay implies an additional GH delay). Because of segmentation of the H and V lines, further hierarchies of same-row, same-MegaLab-column and same-quadrant are implied for both routability and timing purposes. The 20K400 contains 100H lines per MegaLab row, and 80 V lines per LAB-column (80*16 per MegaLab column).

The delay of a point-to-point connection can be categorized as "local" for same-LAB connections, GH+local for same-MegaLab, H+GH+local for adjacent horizontal Mega-Labs, V+GH+local for same octant of the chip, and V+H+GH+local for same-quadrant of the chip. The maximum (worst-case) delay is an HH+VV+GH+local connection.

A local interconnect consumes approximately 1 unit of delay, a GH 2 units of delay, H or V 2 units of delay, and an HH or VV 4 units of delay. Thus the ratio of the shortest (local) to longest (HH+VV+GH+local) connection is roughly 1 to 11.

In a target hardware device, there will be many paths available for routing a given signal. Each of the interconnects identified above is a connection responsible for conveying signals between groups, as in the case of "global horizontal" or "global vertical" interconnects, or to interconnect elements within a group as for example accomplished by local interconnects 318 shown in FIG. 3. The interconnects are connections which make up segments or connections of a path.

Each MegaLab 306 also has a 2K-bit configurable RAM, which is accessible in much the same way as a LAB. The delay through a RAM is also considered to be a fixed value independent of placement However the choice of which MegaLab contains a particular logical RAM and the routing of address and data lines to the RAM are part of the placement problem.

Placement Algorithm

Figure 4:
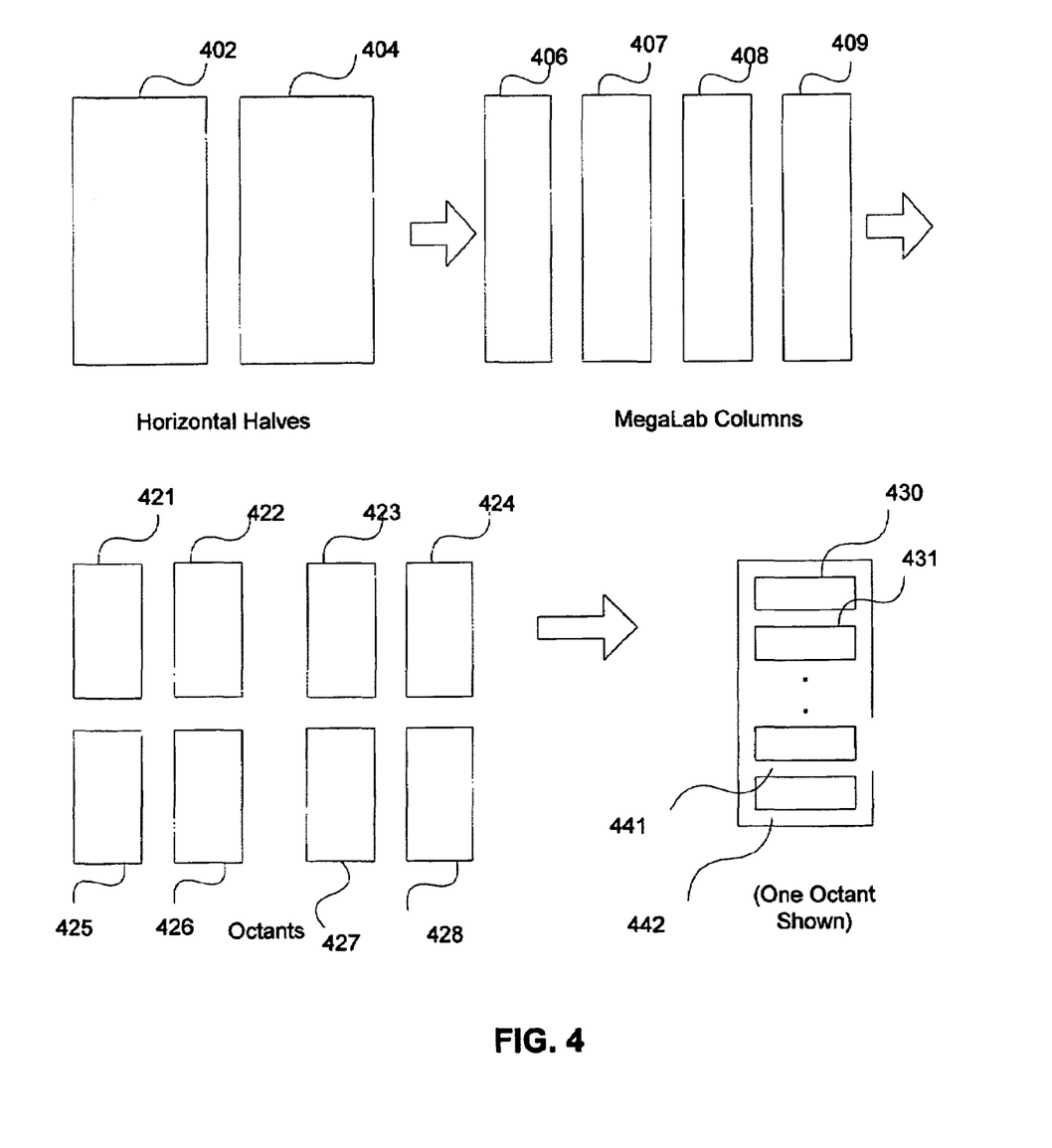
FIG. 4 illustrates recursive partitioning in the hardware device illustrated in FIG. 3.

The natural way to place a netlist in this type of part is to do a recursive k-way partition. Each step will be referred to as a phase in the overall algorithm. Though the effectiveness of this type of algorithm is greatly affected by implementation details, the basic recursive partitioning flow is as follows and as illustrated in FIG. 4.

Phase 1: Partition the netlist into a left 402 and right 404 horizontal halves, minimizing the overall cut-size (number of HH wires).

Phase 2: Bi-partition each half independently, dividing the netlist into horizontal quarters 406, 407, 408, and 409 (MegaLab columns) to minimize cut-size (H lines).

Phase 3: Partition the entire netlist into a top half and bottom half, minimizing cut-size (VV wires) while respecting the MegaLab columns previously assigned. The result is 8 octants 421–428.

Phase 4: Partition the top and bottom netlists 13-ways into rows (430–442) to minimize the number of connections (V wires) while respecting the previous vertical partitions.

Phase 5: Partition MegaLabs into LABs, trying to balance V-line usage in individual columns, and the input-region of each LAB.

In each of these partitioning steps, the implementation details must count and balance secondary signals (clock, clear, enable), RAMs, and logic cells separately, as the resulting partition must be correct for all types of logic. Because carry-chains and other data-path elements have regular output, care must be taken to balance their relative placement to balance local congestion.

A recursive partitioning approach has a number of advantages. The complexity of the algorithm is buried in the partitioning subroutine, a well understood problem in CAD which can be regularly updated independent of multiple architecture families. Graph partitioning algorithms are typically fast (linear) time, and thus the overall algorithm is also linear. Further, the partitioner can be de-coupled from the architecture-specific details and easily updated with new partitioning technology. The overall algorithm is simple and easy to maintain, even in the presence of heterogeneous resources and other constraints. Because the production system has to deal with numerous such additions to deal with a real architecture, and is regularly modified to deal with new architecture families and devices, these latter issues are particularly important. This method permits the introduction of a timing-driven algorithm within the context of the existing place and route flow.

In hierarchical programmable logic architectures such as the Altera APEX and FLEX families, the standard algorithm for automatic placement is based on recursive partitioning of the netlist into more and more refined bins in the physical device. In the more hierarchical APEX architecture, the design goes through approximately 5 different stages or phases of partitioning. In early partitioning phases, signals need to be identified as critical if they lie on a critical path. However, due to the unknown effects of later partitioning phases, it is extremely difficult to determine in advance which paths or portions of the netlist will after full placement of the source electronic design into the target device lie on the placed critical path. Paths initially thought to be non-critical based on the number of connections in the path may, after several cuts, turn out to be critical because of the delays added by the cuts, i.e. wiring across the physical boundaries of the device. The present invention provides more accurate information as to the delays anticipated from future cuts by using statistical prediction for the delays on uncut segments of paths which have not yet been placed. The statistical estimate of delays from future cuts is based on empirical data developed from placement of other designs using conventional partitioning techniques. The statistical data is generated for each phase of the partition process and is defined for the purposes of this application as a phase-local for each partitioning phase.

Phase Local

For a hierarchical architecture with h levels of hierarchy the phase-local for phase i is defined to be a weighted average of the probabilistic delays of all stages i+1 to h.

For a range of benchmark designs, a statistical distribution is generated, representing for each "local" connection after phase i, the resulting average number of H, V, GH and local wires occurring for that connection after complete placement Though not crucial, it is of practical benefit to calculate this value statistically.

For the example of the APEX 20K400, for the first 2 phases of the 5 partitioning phases involved, phase_local(1)=$f_1$(HH+VV+gh+loc, H+W+gh+loc, H+V+gh+loc, ..., gh+loc, loc), phase_local(2)=$f_2$(H+VV+gh+loc, H+V+gh V+gh+loc, ..., gh+loc, loc), where the value phase_local(i) refers to the value of a local delay in the i'th partitioning phase. As the partitioning process proceeds through the hierarchy, the phase locals will represent smaller delays since the subsequent cuts after the first two will not cross major boundaries in the device.

In one embodiment the statistical estimate is a simple linear combination of future cut-delays weighted by their empirical probability of occurrence. The function $f_1$ is prob(HH)*delay(HH)+prob(VV)*delay(VV), . . . For phase $f_2$ the HH cuts are now known exactly (they occurred in a previous cut or phase of the partitioning process and their associated delays are known for the device) and do not appear in the calculation. All probabilities adjust accordingly. As described further below, in addition to the phase-local based on average expected delays, pessimistic and optimistic phase locals can be generated form the experimental results from the sample designs.

It should be understood that the present invention is not limited to the above described hierarchical architecture or any other hardware architecture for that matter. In fact, it is not even limited to programmable logic devices. It may be employed generically in target hardware devices as broadly defined above and including applications such as ASIC's, circuit boards, full custom chips, and PLD's. PLDs are just one example of integrated circuits that can benefit from application of the present invention.

Figure 5:
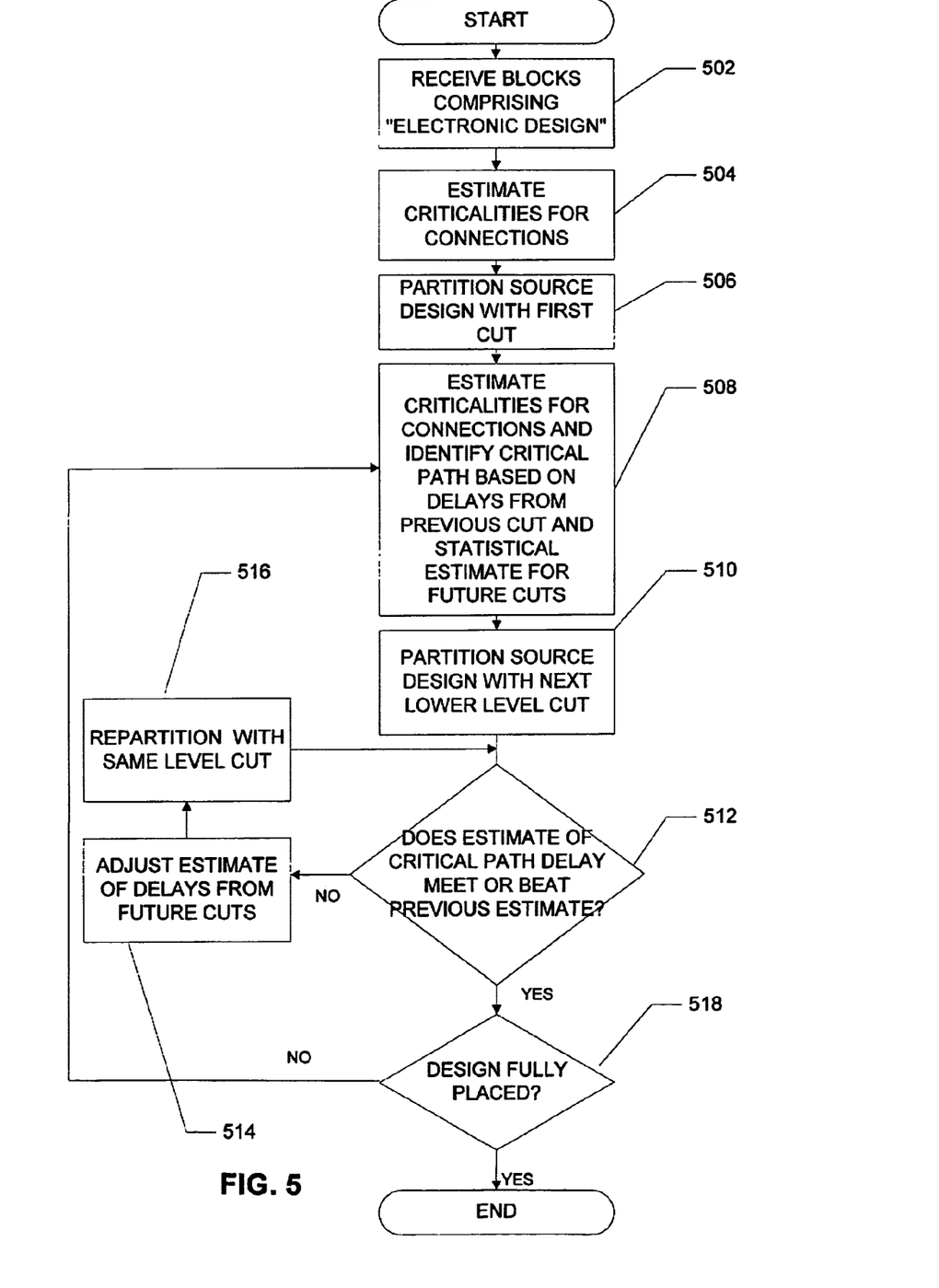
FIG. 5 is a flowchart illustrating a method for generating an electronic design based on criticalities of connections in accordance with methods of the invention.

FIG. 5 is a flowchart illustrating a method for generating an electronic design on a target device based on criticalities determined in accordance with the methods of the present invention. The source electronic design may be provided as a netlist in this description to the placement tool using partitioning (502). The netlist will define the logic functions, often at a gate level. The partitioning tool will then proceed to make an initial estimate of delays across all paths. In the first phase of partitioning, none of the circuit has yet been placed. The information available to the tool, therefore, is limited to estimating delays across uncut connections.

At this point the estimate of delays attributable to future cuts is based on a unit delay for all future cuts. In other words, since all connections of the source electronic design are uncut, the probabilistic measure equates to each path having an estimated delay proportional to the number of connections in the path, i.e. the length of the path. Determining the criticalities for the paths (504) allow the critical paths to be identified in preparation for another partitioning cut To the extent feasible, first cuts are avoided or minimized on these critical paths when the hardware device is partitioned with the first cut (506). As described above, the wires across the first cut will typically constitute a connection across the device's segmentation buffer (e.g. an HH or VV line) and will experience one of the worst delays in the device. The net effect of the initial cut is that some paths which previously may have appeared as non-critical may become critical because of the added delays due at lest in part from crossing this major boundary.

After the first cut, critical paths are identified based on actual delay data from the known cuts and probabilistic estates generated from the evaluation of other designs using traditional partitioning algorithms (508). The probabilistic estimates constitute the phase-local for that phase. For example, since the first cut may have placed the source design into left and right halves of the target device, HH delays from this cut are known. For those paths crossing the vertical boundary of the device, the total path delay will be a sum of the cuts and non-cuts. The cuts represent the delays using RH interconnects whereas the non-cuts represent the probabilistic estimate of future cuts. For example, for a given path comprising 7 connections and cut once by a partition, the estimated delay is the sum of the actual cuts (1 HH connection) and 6 non-cuts (6 times the phase local for this phase). This method permits a more accurate estimation of the delays to be expected from future cuts tan provided by the mere use of a unit-delay. The combination of actual delays for cut connections and statistical estimates as applied to non-cut connections allows the tool to more accurately identify the critical paths. The source design is then partitioned with another cut using this revised critical path data (510), again attempting to minimize or avoid cuts across the newly identified critical paths. In one embodiment, a determination would follow as to whether the source design was fully placed (518), such as, for example, in the APEX 20K device described, whether the partitioning had proceeded through the 5 different phases or levels of hierarchy. Where the design had not yet been fully placed, the method would proceed to estimate the criticalities of connections (508), this time based on the new data, i.e. actual data from another cut or phase of partitioning and a new phase local for the upcoming phase. The new phase local would be a function of the probabilities applicable to the levels of cuts not yet made. These probabilities are determined by examining a sampling of electronic designs placed by conventional techniques and determined the percentage of cuts attributable to each level of cut. Following each partition phase, this loop, which includes estimating criticalities based on the new delay data (508) and partitioning to avoid or minimize cuts on critical pats so determined (510) is repeated until full placement of the source design.

In another embodiment, after each partition cut, a determination is made as to whether the delays from the partition meet or beat the previous estimate (512). The previous estimate is the estimate of the critical path delays before the most recently performed partitioning cut. For example, after a phase 2 partition, critical paths to be avoided in the next partition are identified by calculating path delays as a sum of actual delays generated by previous cuts and the statistical estimates as to delays from future cuts. Where the looping option represented by block 512 is incorporated into the process, the estimated critical path delays calculated after the last partitioning cut are compared with the previous estimate of critical path delays based on the statistical data or phase-local for that type of cut. If there is a sufficient difference, i.e. the critical path delays are getting worse, the phase local will be adjusted to reflect the proportionate share of actual delays experienced in the most recent partitioning phase and appropriate adjustments made to the probabilistic estimates for the lower levels of hierarchical connections to develop a new phase local. The adjusted phase local would in this case show an increased delay to reflect the actual observations from the most recent partition attempt where the delays from the cut were longer than previously estimated (before the cut). Using the new phase local data, the design will be repartitioned with the same level cut (516) followed by a determination as to whether the new delays correspond to the most recent estimate, (512). If the estimate of critical path delay does not meet or beat a previous estimate, an estimate of delays from future cuts is adjusted, (514). This loop can repeat until satisfactory correspondence between the actual and estimated delays for that partition level occurs. This process continues until the design is fully placed (518).

Figure 6:
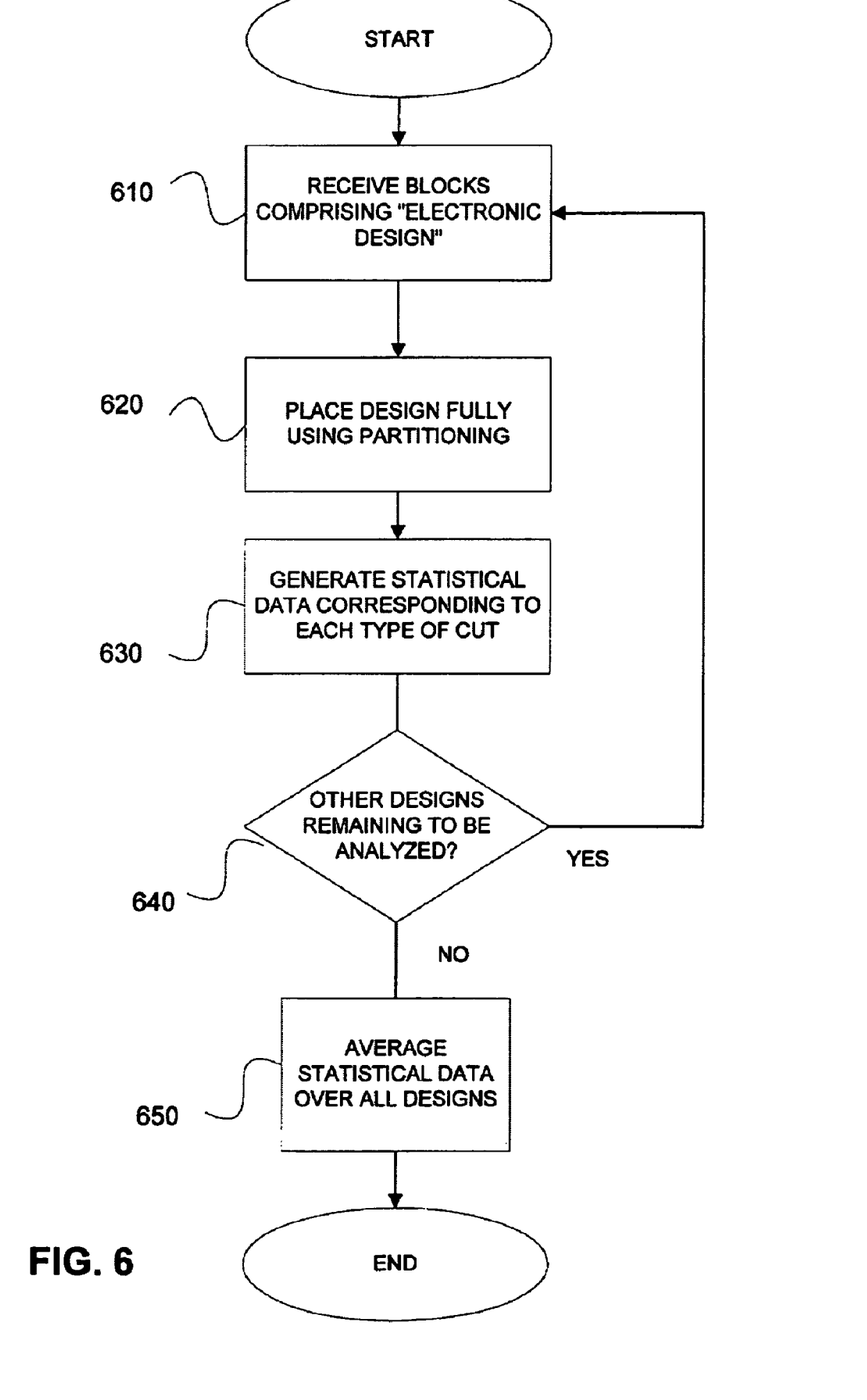
FIG. 6 is a flowchart illustrating a method for generating statistical data for phase delays in accordance with the methods of the invention.

The statistical data for delays to be attributed to fixture cuts ensures a more accurate delay estimate than provided by estimates based only on the length of paths. As illustrated in the flowchart of FIG. 6, in order to generate the statistical data at least one electronic design is placed according to conventional partitioning techniques. The flow in this method commences with the receipt of the electronic design, which maybe in the form of a netlist (610). The design is placed fully using conventional partitioning techniques (620) without reference to statistical estimates for future cuts. In other words, the critical path at each phase is determined by a combination of the actual cuts across sections, and a unit delay assigned to each of the uncut connections. Following full placement of the design, the connections are analyzed to determine the percentage of each type of cut in the fully placed design (630). A separate phase local is generated for each partition phase. For example, the probabilistic estimate or phase local for phase 3 would be determined by adding all connections cut by levels 3, 4, and 5 partitions and determining a probabilistic estimated delay by multiplying the percentage of that particular level cut by the actual delays associated with that type of cut in the architecture. The process then to determine whether other designs in the sampling need to be analyzed (640). Once statistical data has been generated for all the designs in the sampling, the data is averaged over all designs (650). The conventional partitioning algorithm described is used to place all of the sample designs in an identical hardware target device. The averaged data comprises the statistical estimates to be used in block 508, shown in FIG. 5.

In the embodiment described above, the statistical estimates (or phase-local) gathered from the experimental results from implementing the sample designs is based on the typical or expected phase local, i.e., the $50^{th}$ percentile wires. For example, after partitioning with type 1 (HH and type 2(H) wires in an APEX device as illustrated in FIG. 3 above, the statistical estimates from the sample designs might indicate that in the remaining 3 partition phases, 20% of the wires are type 3 cuts, 30% are type 4 cuts, and 50% are type 5 cuts. Assuming that the known delays for type 3 cuts are 2 ns, for type 4 cuts are 1 ns, and type 5 cuts are 0.5 ns, then the phase local typical is derived as follows:

phase local=0.2*(2 ns)+0.3*(1 ns)+0.5*(0.5 ns)+0.95 ns ($50^{th}$ percentile)

In one embodiment, rather than using a $50^{th}$ percentile phase local, a pessimistic phase local is used to estimate the delays from future cuts. The pessimistic phase-local determines the resulting delays based on connections on the path receiving worse than average behavior in future cuts. For example, the pessimistic phase-local may be defined as the weighted average based on the $95^{th}$ percentile wires in the experimental results form the sample designs. In similar fashion, and in another embodiment, an optimistic phase local is used to estimate future delays. For example, a user might select the weighted average based on the $25^{th}$ percentile wires from the experimental results of the sample designs. This would provide an estimate as to future delays based on an assumption that the wires will have delays better (shorter) than average. The actual percentages described are for illustration purposed only and the invention should not be construed as limiting the invention. Variations and modifications will be apparent to those of skill in the art.

Implementation Apparatus

Embodiments of the present invention relate to an apparatus for performing the above-described operations. This apparatus may be specially constructed for the required purposes, or it may be a general-purpose computer selectively activated or reconfigured by a computer program stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method. The required structure for a variety of these machines will appear from the description given above.

In addition, embodiments of the present invention further relate to computer readable media that include program instructions for performing various computer-implemented operations. The media may also include, alone or in combination with the program instructions, data files, data structures, and the like. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The media may also be a transmission medium such as optical or metallic lines, wave guides, etc. including a carrier wave transmitting signals specifying the program instructions, data structures, etc. Examples of program instructions include both machine code, such as produced by a compiler, and files containing higher level code that may be executed by the computer using an interpreter.

Figure 7:
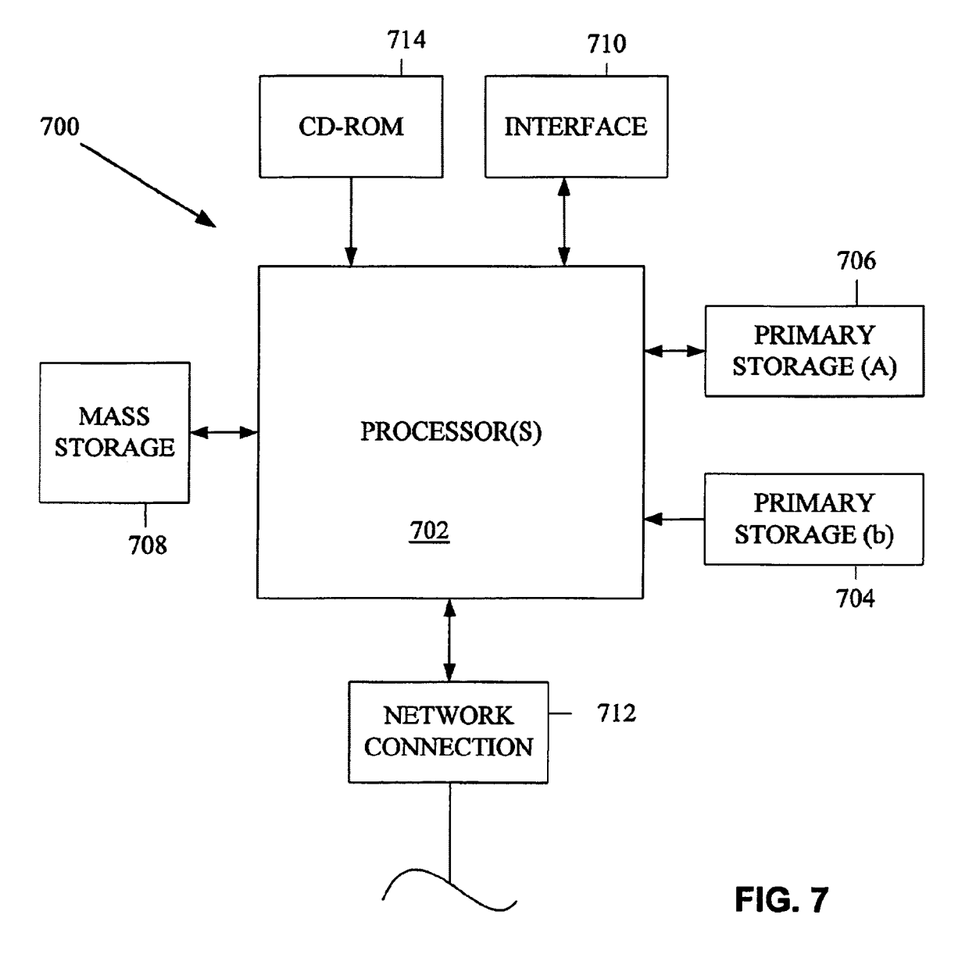
FIG. 7 is a block diagram of a general-purpose computer system that may be employed to implement the present invention.

FIG. 7 illustrates a typical computer system in accordance with an embodiment of the present invention. The computer system 700 includes any number of processors 702 (also referred to as central processing units, or CPUs) that are coupled to storage devices including primary storage 706 (typically a random access memory, or "RAM"), primary storage 704 (typically a read only memory, or "ROM"). As is well known in the art, primary storage 704 acts to transfer data and instructions uni-directionally to the CPU and primary storage 706 is used typically to transfer data and instructions in a bi-directional manner. Both of these primary storage devices may include any suitable type of the computer-readable media described above. A mass storage device 708 is also coupled bi-directionally to CPU 702 and provides additional data storage capacity and may include any of the computer-readable media described above. The mass storage device 708 may be used to store programs, data and the like and is typically a secondary storage medium such as a hard disk that is slower than primary storage. It will be appreciated that the information retained within the mass storage device 708, may, in appropriate cases, be incorporated in standard fashion as part of primary storage 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 702 optionally may be coupled to a computer or telecommunications network using a network connection as shown generally at 712. With such a network connection, it is contemplated that the CPU might receive information from the network, or might output information to the network in the course of performing the above-described method. The above-described devices and materials will be familiar to those of skill in the computer hardware and software arts.

The hardware elements described above may be configured (usually temporarily) to act as multiple software modules for performing the operations of this invention. For example, instructions for running an optimizing method and/or compiler may be stored on mass storage device 708 or 714 and executed on CPU 708 in conjunction with primary memory 706.

Figure 8:
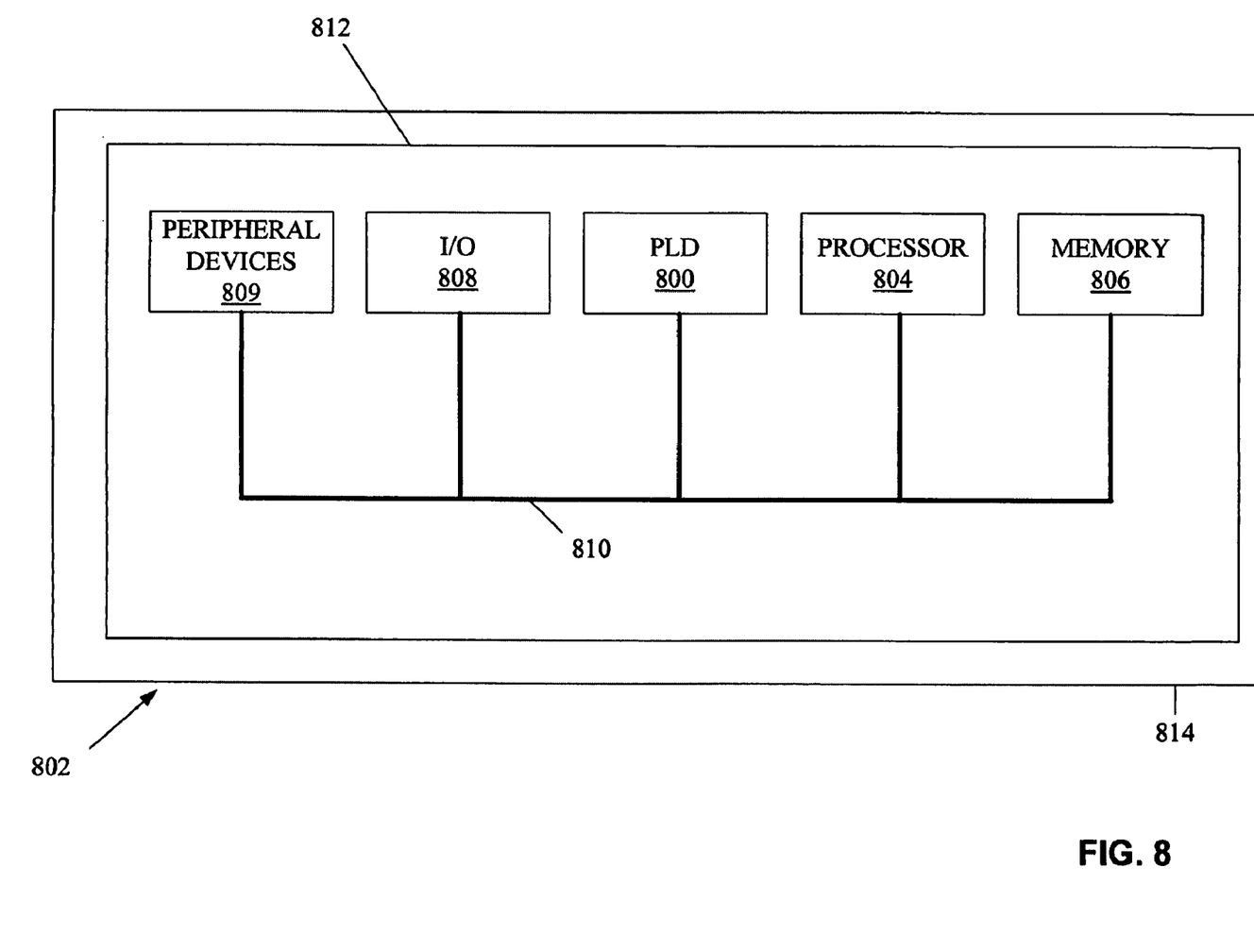
FIG. 8 is a block diagram of a programmable logic device and associated system, in which the PLD may be generated in accordance with the methods of this invention.

In one specified embodiment this invention also relates to programmable logic devices programmed with a design prepared in accordance with the above-described methods. The invention further relates to systems employing such programmable logic devices. FIG. 8 illustrates a PLD 800 of the present invention in a data processing system 802. The data processing system 802 may include one or more of the following components: a processor 804, memory 806, I/O circuitry 808, and peripheral devices 809. These components are coupled together by a system bus 810 and are populated on a circuit board 812 that is contained in an end-user system 814.

The system 802 can be used in a wide variety of applications, such as computer networking, data networking, instrumentation, video processing, digital signal processing, or any other application where the advantage of using programmable logic (including reprogrammable logic) is desirable. The PLD 800 can be used to perform a variety of different logic functions. For example, PLID 800 can be configured as a processor or controller that works in cooperation with processor 804. The PLD 800 may also be used as an arbiter for arbitrating access to a shared resource in the system 802. In yet another example, the PLD 800 can be configured as an interface between the processor 904 and one of the other components in the system 802. It should be noted that the system 802 is only exemplary.

The foregoing describes the instant invention and its presently preferred embodiments. Numerous modifications and variations in the practice of this invention are expected to occur to those skilled in the art. For instance, the techniques and systems of the present invention are suitable for use with a wide variety of EDA tools and methodologies for programming a device. Therefore, the described embodiments should be taken as illustrative and not restrictive, and the invention should not be limited to the details given herein but should be defined by the following claims and their full scope of equivalents.

The invention claimed is:

1. A method of estimating a critical path delay during a source electronic design placement into a target hardware device, comprising:
  receiving an electronic representation of the source electronic design;
  determining a path criticality in the source electronic design based on,
    determining an actual delay corresponding to a connection already placed across a first boundary in the target device, and
    determining a statistical estimate for a future delay corresponding to an associated future connection to be placed across a second boundary in the target device, wherein the statistical estimate for the future delay is made using estimates of future cuts not yet made in the target device; and
  partitioning at least a portion of the source design by placing at least the portion of the source design across boundaries in the target device based on the determined actual delay and the statistical estimate for a future delay.

2. The method of claim 1 wherein the placing is biased towards a state in which an individual path having a relatively high criticality is not changed so as to increase an associated delay.

3. The method of claim 1 wherein the placing is biased towards a state in which an individual path having a relatively high criticality is changed in a manner that reduces the associated delay.

4. The method of claim 2 wherein the estimate for the future delay is generated by performing partitioning techniques on at least one other electronic source design.

5. The method of claim 1 wherein the electronic representation is received in the form of hardware description language coding.

6. The method of claim 1 wherein the electronic representation is received in the form of a schematic electronically captured.

7. The method of claim 1 wherein the electronic representation is received in the form selected from a group comprising: a netlist, an electronically captured schematic, and a coded hardware description language.

8. The method of claim 1 wherein the connections include at least one of conductive lines and switches.

9. The method of claim 1 wherein the target hardware device is selected from a group comprising: a complex programmable logic device (CPLD), a field programmable gate array (FPGA), an application specific integrated circuit (ASIC), a programmable logic device, a general purpose microprocessor, and a board level circuit implementation.

10. The method of claim 1 further comprising iteratively repeating the determining a path criticality and the partitioning at least a portion of the source design.

11. The method of claim 1, further comprising:
  determining whether to repartition the at least a portion of the source design after the partitioning; and
  if necessary, adjusting the estimates of delays from future partitions.

12. The method of claim 11 wherein determining whether to repartition at least a portion of the source electronic design is determined by comparing the critical path delays resulting from the partitioning cut with the estimate of critical path delays prior to the partitioning cut.

13. The method of claim 10 wherein adjusting the estimates of delays from future partitions comprises:
substituting a percentage of delays attributed to the partition in the statistical estimate with a new percentage derived from the critical path delay results from the partitions.

14. The method of claim 1 wherein the statistical estimate for future delay comprises:
receiving at least one source design;
placing the at least one source design using partitioning methods to place the device across boundaries in the target device; and
generating statistical data corresponding to each type of boundary crossed in the target device.

15. The method of claim 14 wherein the statistical data represents the proportion of each hierarchical type of cut of the entire number of cuts in the fully placed design.

16. The method of claim 15 is wherein the statistical estimates correspond to the weighted average of the statistical data generated.

17. The method of claim 16 wherein the weighted average is based on a predetermined number or percentage of the slowest delays.

18. The method of claim 16 wherein the weighted average is based on a predetermined number or percentage of the fastest delays.

19. A method for generating statistical estimates for future delays on uncut connections on a path in placing a design by partitioning methods comprising:
receiving at least one source design;
placing the at least one source design using partitioning methods to place the device across boundaries in the target device; and
generating statistical data corresponding to each type of boundary crossed in the target device, wherein the statistic data is generated using estimates of future cuts not yet made in the target device.

20. The method of claim 19 wherein the statistical data represents the proportion of each hierarchical type of cut of the entire number of cuts in the fully placed design.

21. The method of claim 19 wherein the statistical estimates correspond to the weighted average of the statistical data generated.

22. The method of claim 21 wherein the weighted average is based on a predetermined number or percentage of the slowest delays.

23. The method of claim 21 wherein the weighted average is based on a predetermined number or percentage of the fastest delays.

24. A computer program product comprising:
a machine readable memory on which is provided program instructions for a method of placing a source electronic design into a target hardware device by partitioning methods, the instructions comprising:
code for receiving an electronic representation of the source electronic design;
code for determining a path criticality in the source electronic design based on determining an actual delay corresponding to a connection already placed across a first boundary in the target device,
code for determining a statistical estimate for a future delay corresponding to an associated future connection to be placed across a second boundary associated with a future cut not yet made in the target dance; and
code for partitioning at least a portion of the source design by placing the at least a portion of the source design across boundaries in the target device based on the criticalities determined.

25. The computer program product of claim 24 wherein the code for determining the statistical estimate for future delay comprises:
code for receiving at least one source design;
code for placing the at least one source design using partitioning methods to place the device across boundaries in the target device; and
code for generating statistical data corresponding to each type of boundary crossed in the target device.

26. The computer program product of claim 25 wherein the statistical data represents the proportion of each hierarchical type of cut of the entire number of cuts in the fully placed design.

27. The computer program product of claim 26 wherein the statistical estimates correspond to the weighted average of the statistical data generated.

28. The computer program product of claim 27 wherein the weighted average is based on a predetermined number or percentage of the slowest delays.

29. The computer program product of claim 28 wherein the weighted average is based on a predetermined number or percentage of the fastest delays.

30. A computer system having a central processing unit (CPU) coupled to a memory, comprising:
an interface for communicating with an individual;
wherein the computer system is configured to receive an electronic representation of the source electronic design;
wherein the computer system is further configured to,
determine a path criticality in the source electronic design based on determining an actual delay corresponding to a connection already placed across a first boundary in the target device, and
determine a statistical estimate for a fixture delay corresponding to an associated future connection to be placed across a second boundary associated with a fixture cut not yet made in the target device; and
wherein the computer system is further configured to partition at least a portion of the source design by placing the at least a portion of the source design across boundaries in the target device based on the determined actual delay.

* * * * *